United States Patent [19]

Pedersen et al.

[11] Patent Number: 4,697,335

[45] Date of Patent: Oct. 6, 1987

[54] METHOD OF MANUFACTURING A FILM-TYPE ELECTRONIC DEVICE

[75] Inventors: David Pedersen, Spring Grove; Vincent N. Cupidro, Arlington Heights, both of Ill.

[73] Assignee: Hy-Meg Corporation, Addison, Ill.

[21] Appl. No.: 846,105

[22] Filed: Mar. 31, 1986

[51] Int. Cl.⁴ ............................................. H01C 17/06
[52] U.S. Cl. ...................................... 29/620; 29/846;
428/204; 428/195; 156/277; 156/155
[58] Field of Search .................. 29/620, 846; 156/155,
156/277, 239, 240; 427/149; 428/204

[56] References Cited

U.S. PATENT DOCUMENTS

| 2,711,983 | 6/1955 | Hoyt | 156/155 |
| 3,266,661 | 8/1966 | Dates | 29/620 |
| 3,729,819 | 5/1973 | Horie | 29/846 |

Primary Examiner—P. W. Echols
Attorney, Agent, or Firm—Douglas B. White

[57] ABSTRACT

There is provided a soluble chemical layer affixed to a rigid backing, whereupon an electronic configuration is printed and covered with a lacquer. The pattern and lacquer coating are then separated from the backing by dissolving the soluble chemical. Once free, the pattern is transferred to and fused to the substrate.

7 Claims, 5 Drawing Figures

FIG. 1
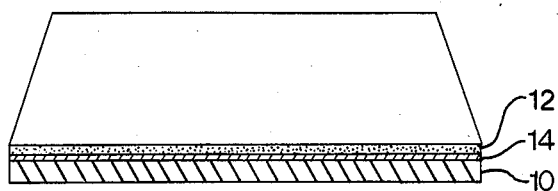
FIG. 2
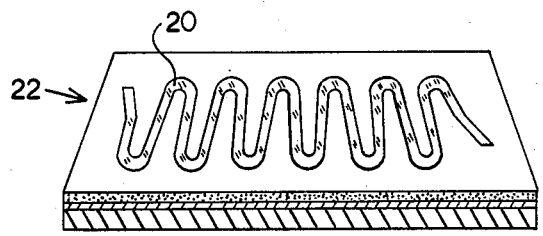
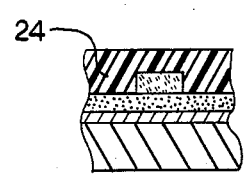
FIG. 2A
FIG. 3
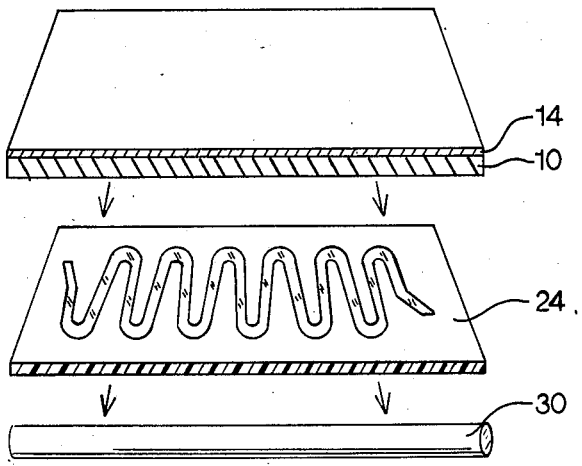
FIG. 4

METHOD OF MANUFACTURING A FILM-TYPE ELECTRONIC DEVICE

BACKGROUND OF THE INVENTION

The present invention relates to the field of film-type electronic devices and more particularly to film-type resistors and methods of manufacturing same.

Film-type electronic devices, and particularly film-type resistors, have been generally known, but efficient and effective methods of manufacturing have long been sought after. An early method required the spraying of the film material onto the substrate and then removing portions by cutting or grinding. Alternatively, a method was devised to draw a pattern on the substrate using an applicator with liquid film (U.S. Pat. No. 1,857,769). More recently, apparatus was developed to allow silk-screen printing of the desired pattern directly onto a cylindrical substrate (U.S. Pat. No. 3,880,609). This system suffers from the fact that expensive and elaborate equipment is needed for the operation.

Production of film-type electronic devices becomes even more difficult when the substrate required to carry the device is curved or irregular in shape. Since flat substrates are either impractical or undesirable in many applications, curved or contoured substrate surfaces are being encountered most often. With film-type resistors it is common to use a cylindrical substrate due to its superior thermal and physical shock properties. The silk-screening process described in U.S. Pat. No. 3,880,609 was designed for use with cylindrical substrates ground smooth with centerless grinding techniques, and is not possible when substrate surfaces are not ground sufficiently smooth and parallel to operate with the printing equipment. Accordingly, this prior process requires precision preparation of the substrates and careful quality control to assure adequate print quality.

Early manufacturing process (U.S. Pat. No. 3,266,661) for the production of printed circuits employed decalcomania paper upon which a circuit was silk-screened and subsequently transferred to the printed circuit board. Although presenting an attractive alternative to scribing or printing directly onto the substrate, this process was never perfected for film resistors due to the inherent disintegration of the printed resistive ink pattern during drying.

SUMMARY OF THE INVENTION

Accordingly, it is a principal object of the present invention to provide a method of manufacturing film electronic devices which is more efficient, economical and reliable than scribing or silk-screen printing directly onto the substrate. It is a further object of the present invention to provide a versatile manufacturing system which is adaptable to substrates of a plurality of surface configurations.

Generally there is provided a soluble chemical layer affixed to a rigid backing, whereupon an electronic configuration is printed, dried and covered with a lacquer. The pattern and lacquer coating are then separated from the backing by dissolving the soluble chemical. Once free, the pattern is transferred to and fused to the substrate.

Other objects and advantages of the invention will become apparent upon reading the following detailed description and upon reference to the drawings, in which:

FIG. 1 is a perspective view of the base prepared for printing of the pattern;

FIG. 2 is a perspective view of the base of FIG. 1 after printing and lacquer application;

FIG. 2a is a cut-away view showing a cross-section of FIG. 2;

FIG. 3 is a perspective view showing removal of the pattern from the base for positioning upon the substrate;

FIG. 4 is a perspective view of a completed device showing a substrate carrying the printed pattern fused thereon.

While the invention will be described in connection with the preferred embodiment, it will be understood that it is not the intent to limit the invention to that embodiment. On the contrary, it is the intent to cover all alternatives, modifications and equivalents as may be included within the spirit and scope of the invention as defined by the appended claims.

DESCRIPTION OF THE PREFERRED EMBODIMENT

Turning to FIG. 1 there is shown the multilayer base of the present invention arranged to receive an electro-conductive pattern in accordance with the present invention. This base is comprised of a rigid first layer 10 and a water soluble upper layer 12. The water soluble layer may be obtained commercially as decalcomania paper which consists of the water soluble layer deposited upon a paper 14. In the preferred embodiment, the rigid first layer is formed of a stiff cardboard or similar material which enhances the absorption of water during release of the electro-conductive pattern.

Any electro-conductive coating material which may be applied as a liquid, paste or viscous mixture will generally be suitable for use in the present invention. As shown in FIG. 2, a pattern 20 (in this case a non-inductive resistive pattern) is applied to the upper soluble layer 12 of the base. This may be accomplished by any means well known in the art such as scribing, silk screening, or any other method capable of depositing a determinable thickness of material. After application of the pattern, the entire device 22 is dried in an oven at approximately 200 degrees Fahrenheit for about 10 minutes. Preparation of the pattern in this manner avoids the occurrence of bubbles and cracks that have plagued prior manufacturing methods using decalcomania paper.

Once dried, the pattern is covered with a substantially water insoluble film 24. Generally this is a lacquer or the like applied in any convenient fashion to provide uniform reinforcing coverage over the complete electro-conductive pattern.

In this form, the electronic device may be utilized without further processing and may be shipped to customers as a completed, packaged device. The customer's end use may incorporate the pattern and rigid base into the final circuit configuration, or the customer may now remove the pattern for application to a specific substrate. To remove the pattern, the entire device 22 is soaked in a water bath to dissolve the soluble layer 12. When dissolved, the pattern floats free (FIG. 3) supported by the lacquer 24. The pattern may now be applied to a smooth surface of any shape. For a non-inductive resistor, the preferred surface is a cylindrical ceramic substrate 30, shown in FIG. 3 positioned to receive the electro-conductive pattern.

After application to the substrate (FIG. 4), the electro-conductive pattern may be fired in a kiln or the like to remove the lacquer and to fuse the pattern to the substrate. While heating rates and temperatures are dependent upon the materials used, they are readily known and available to those skilled in the art.

For some applications, conductors 40 may be added to provide electrical access to the device. In the preferred embodiment, these are composed of a silver compound in a liquid or paste-like form which is applied to the substrate in contact with the extremities of the electro-conductive pattern.

In summary, there has been shown an improved method for the manufacture of a film-type electronic device comprising providing a printable, soluble layer upon a rigid backing; printing and drying an electro-conductive pattern on the soluble layer; superimposing a lacquer over the pattern; dissolving the soluble layer to free the pattern; and adhering the pattern to a substrate.

We claim:

1. A method of manufacturing a film-type electronic device comprising:
   a. attaching a water soluble layer to a rigid reinforcing base,
   b. applying a pattern of film having electrical properties to said soluble layer, and
   c. drying said pattern of film while maintaining said soluble layer in attachment with said base;
   d. applying a water insoluble top layer in adhering overlying relation to said pattern of film to provide support thereto.

2. The method of claim 1 further comprising:
   a. dissolving said soluble layer to free said pattern of film and accompanying top layer, and
   b. applying said pattern of film to a substrate.

3. The method of claim 2 wherein said pattern of film is applied through silk-screen methods to said soluble layer, and further comprising the step of drying said film pattern prior to application of said top layer.

4. The method of claim 3 further comprising the step of heating said substrate with the pattern of film applied to a temperature and for a duration sufficient to fuse the pattern of film to said substrate.

5. The method of claim 3 wherein said soluble layer is comprised of decalcomania paper adhered to said rigid reinforcing base.

6. The method of claim 5 wherein said reinforcing base is fluid absorbable to enhance the dissolution of said soluble layer.

7. A film-type electronic device comprising:
   a. a substrate, and
   b. a film pattern having electrical properties applied to said substrate by attaching a water soluble layer to a rigid reinforcing base,
      applying a pattern of film having electrical properties to said soluble layer,
      drying said pattern of film while maintaining said soluble layer in attachment with said base,
      applying a water insoluble top layer in adhering overlying relation to said pattern of film to provide support thereto,
      dissolving said soluble layer to free said pattern of film and accompanying top layer, and
      applying said pattern of film to said substrate.

* * * * *